(12) United States Patent
Mohammed et al.

(10) Patent No.: US 9,167,710 B2
(45) Date of Patent: Oct. 20, 2015

(54) EMBEDDED PACKAGING WITH PREFORMED VIAS

(71) Applicant: Invensas Corporation, San Jose, CA (US)

(72) Inventors: Ilyas Mohammed, Santa Clara, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 192 days.

(21) Appl. No.: 13/961,344

(22) Filed: Aug. 7, 2013

(65) Prior Publication Data

US 2015/0043190 A1 Feb. 12, 2015

(51) Int. Cl.
*H05K 7/00* (2006.01)
*H01L 21/48* (2006.01)
(Continued)

(52) U.S. Cl.
CPC ............... *H05K 7/00* (2013.01); *H01L 21/4846* (2013.01); *H01L 21/568* (2013.01); *H01L 23/5389* (2013.01); *H01L 24/19* (2013.01); *H01L 24/20* (2013.01); *H01L 24/24* (2013.01); *H01L 24/96* (2013.01); *H05K 1/185* (2013.01); *H01L 24/32* (2013.01); *H01L 24/73* (2013.01);
(Continued)

(58) Field of Classification Search
USPC .......... 361/735, 760, 761, 748, 790; 174/264, 174/265, 68.1, 250, 261, 262; 257/678, 257/685, 686, 690, 692, 693, 697, 723, 724, 257/734, 737, 738, 773, 778; 438/106, 109, 438/107, 111, 112, 124, 613; 29/852, 592, 29/825
See application file for complete search history.

(56) References Cited

U.S. PATENT DOCUMENTS

2009/0140415 A1* 6/2009 Furuta ........................ 257/700
2009/0239336 A1 9/2009 Lee et al.
(Continued)

FOREIGN PATENT DOCUMENTS

JP 2005033141 A 2/2005
KR 20120075855 A 7/2012
WO 2013065895 A1 5/2013

OTHER PUBLICATIONS

U.S. Appl. No. 13/477,532, filed May 22, 2012.
International Search Report and Written Opinion for Application No. PCT/US2014/050125 dated Feb. 4, 2015.
(Continued)

*Primary Examiner* — Hung S Bui
(74) *Attorney, Agent, or Firm* — Lerner, David, Littenberg, Krumholz & Mentlik, LLP (57) ABSTRACT

Microelectronic assemblies and methods of making the same are disclosed. In some embodiments, a microelectronic assembly includes a microelectronic element having edge surfaces bounding a front surface and contacts at the front surface; rigid metal posts disposed between at least one edge surface and a corresponding edge of the assembly, each metal post having a sidewall separating first and second end surfaces, the sidewalls have a root mean square (rms) surface roughness of less than about 1 micron; a encapsulation contacting at least the edge surfaces and the sidewalls; an insulation layer overlying the encapsulation; connection elements extending through the insulation layer, wherein at least some connection elements have cross sections smaller than those of the metal posts; a redistribution structure deposited on the insulation layer and electrically connecting first terminals with corresponding metal posts through the first connection elements, some metal posts electrically coupled with contacts of microelectronic element.

12 Claims, 8 Drawing Sheets

(51) Int. Cl.
*H01L 21/56* (2006.01)
*H01L 23/538* (2006.01)
*H01L 23/00* (2006.01)
*H05K 1/18* (2006.01)
*H01L 25/10* (2006.01)

(52) U.S. Cl.
CPC ...... *H01L 25/105* (2013.01); *H01L 2224/0401* (2013.01); *H01L 2224/04105* (2013.01); *H01L 2224/12105* (2013.01); *H01L 2224/32145* (2013.01); *H01L 2224/73267* (2013.01); *H01L 2225/1035* (2013.01); *H01L 2225/1058* (2013.01); *H01L 2924/15311* (2013.01); *H01L 2924/18162* (2013.01)

(56) References Cited

U.S. PATENT DOCUMENTS

| | | |
|---|---|---|
| 2009/0261466 A1 | 10/2009 | Pagaila et al. |
| 2013/0049218 A1 | 2/2013 | Gong et al. |
| 2013/0069222 A1 | 3/2013 | Camacho |
| 2013/0182402 A1* | 7/2013 | Chen et al. ............ 361/807 |
| 2013/0234317 A1* | 9/2013 | Chen et al. ............ 257/737 |
| 2014/0021605 A1* | 1/2014 | Yu et al. ............ 257/738 |

OTHER PUBLICATIONS

Written Opinion for Application No. PCT/US2014/050125 dated Jul. 15, 2015.

* cited by examiner

EMBEDDED PACKAGING WITH PREFORMED VIAS

FIELD OF THE INVENTION

The present application describes structures such as that which can be incorporated into a microelectronic assembly which may include an unpackaged semiconductor die or packaged semiconductor die, as well as methods for making such structures.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically between about 0.005 mm and about 0.8 mm in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

An interposer can be provided as an interconnection element having contacts and top and bottom surfaces thereof electrically connected with one or more packaged or unpackaged semiconductor dies at one of the top or bottom surface thereof, and electrically connected with another component at the other one of the top or bottom surfaces. The other component may in some cases be a package substrate which in turn may be electrically connected with another component which may be or may include a circuit panel.

Despite all of the above-described advances in the art, still further improvements in microelectronics assemblies, the individual components thereof, such as interposers and microelectronics elements, and methods of making the same would be desirable.

BRIEF SUMMARY OF THE INVENTION

Microelectronic assemblies and methods of making the same are disclosed herein. In some embodiments, a microelectronic assembly comprises a microelectronic element having a front surface, edge surfaces bounding the front surface, and a plurality of contacts at the front surface, the microelectronic element having a first thickness extending in a first direction away from the front surface. The microelectronic assembly includes substantially rigid metal posts extending in the first direction, the posts disposed between at least one of the edge surfaces and a corresponding edge of the microelectronic assembly. Each metal post has a sidewall separating first and second end surfaces of such metal post from one another in the first direction, wherein the sidewalls of the metal posts have a root mean square (rms) surface roughness of less than about 1 micron. The microelectronic assembly includes a encapsulation having a second thickness extending in the first direction between first and second surfaces of the encapsulation, the encapsulation contacting at least the edge surfaces of the microelectronic element and the sidewalls of the metal posts, wherein the metal posts extend at least partly through the second thickness, and the encapsulation electrically insulates adjacent metal posts from one another. The microelectronic assembly has first and second sides adjacent the first and second surfaces of the encapsulation, respectively, and having terminals at the first side. The microelectronic assembly includes a insulation layer overlying the first surface of the encapsulation at the first side and having a thickness extending away from the first surface of the encapsulation. The microelectronic assembly includes connection elements extending away from the first end surfaces of the metal posts and through the thickness of the insulation layer. The first connection elements electrically connects at least some of the first end surfaces with corresponding terminals, wherein at least some connection elements have cross sections smaller than cross sections of the metal posts. The microelectronic assembly includes an electrically conductive redistribution structure deposited on the insulation layer. The redistribution structure electrically connects the terminals with corresponding first end surfaces of the metal posts through at least some of the connection elements, wherein at least some of the metal posts are electrically coupled with the contacts of the microelectronic element.

In one embodiment, the metal posts extend from the first surface of the encapsulation to the second surface of the encapsulation.

In one embodiment, the first thickness is one of smaller or equal to the second thickness.

In one embodiment, the microelectronic assembly further comprises second connection elements extend in the first direction of the second thickness of the encapsulation from the second end surfaces of the metal posts to the second surface of the encapsulation.

In one embodiment, the second connection elements have sidewalls having an rms surface roughness of greater than about 1 micron.

In one embodiment, the metal posts extending in the first direction of the second thickness of the encapsulation to at least about 50% of the second thickness.

In one embodiment, at least some of the second connection elements have a cross section smaller than that of the metal posts.

In one embodiment, the microelectronic assembly further comprises second terminals at the second side of the microelectronic assembly. The redistribution structure is deposited on the second side of the microelectronic assembly and electrically connects the second terminals with corresponding second end surfaces of the metal posts through at least one of the second connection elements.

In one embodiment, the microelectronic assembly further comprises second terminals at the second side of the microelectronic assembly. The microelectronic assembly further comprises a second insulation layer overlying the second surface of the encapsulation at the second side of the microelectronic assembly and having thickness extending away from the second surface of the encapsulation. The microelectronic assembly further comprises second connection elements extending away from the second end surfaces of the metal posts and through the thickness of the second insulation layer, the second connection elements electrically connecting at least some of the second end surfaces with corresponding second terminals, wherein at least some second connection elements have cross sections smaller than cross sections of the metal posts.

In one embodiment, the first and second thicknesses are the same.

In one embodiment, the microelectronic assembly further comprises second terminals at the second side of the microelectronic assembly. The redistribution structure includes traces extending in a second direction transverse to the first direction beyond the edge surfaces of the metal posts, wherein at least one of the first terminals are electrically coupled with the first end surfaces through the traces, or the second terminals are electrically coupled with the second end surfaces through the traces.

In one embodiment, the microelectronic assembly comprises a second microelectronic element at least partly overlying the first microelectronic element, wherein the second microelectronic element having a first surface, edge surfaces bounding the first surface, the second microelectronic element having a thickness extending in the first direction away from the first surface of the second microelectronic element, wherein the encapsulation contacts at least the edge surfaces of the second microelectronic element.

In one embodiment, a method of forming a microelectronic assembly comprises forming a structure including a microelectronic element having a front surface, edge surfaces bounding the front surface, and a plurality of contacts at the front surface, and substantially rigid metal posts extending in the first direction. The posts are disposed between at least one of the edge surfaces and a corresponding edge of the microelectronic assembly. Each metal post having a sidewall separating first and second end surfaces of such metal post from one another, the sidewalls of the metal posts having a root mean square (rms) surface roughness of less than about 1 micron. The method includes forming a encapsulation having a second thickness extending in the first direction between first and second surfaces of the encapsulation. The encapsulation contacts at least the edge surfaces of the microelectronic element and the sidewalls of the metal posts, wherein the metal posts extend at least partly through the second thickness, and the encapsulation electrically insulates adjacent metal posts from one another. The method includes depositing an insulation layer overlying the first surface of the encapsulation and having thickness extending away from the first surface of the encapsulation. The method includes forming connection elements extending away from the first end surfaces of the metal posts and through the thickness of the insulation layer, wherein at least some connection elements have cross sections smaller than cross sections of the metal posts. The method includes depositing an electrically conductive redistribution structure on the insulation layer, the redistribution layer electrically connecting at least some metal posts with the contacts of the microelectronic element. The method includes forming terminals at a first side of the microelectronic assembly adjacent to the first surface of the encapsulation, wherein the connection elements electrically connecting at least some first end surfaces with corresponding terminals.

In one embodiment, prior to forming the structure, the metal posts extend in the first direction from a first surface of a conductive layer, the posts disposed between a first portion of the first surface of the conductive layer and a corresponding edge of the conductive layer.

In one embodiment, forming the structure further comprises attaching the front surface of the microelectronic element to the first portion of the first surface of the conductive layer.

In one embodiment, prior to forming the structure, the method further comprises providing a substrate having a thickness extending in the first direction from a first surface to a second surface of the substrate, the substrate having a plurality of rigid elements extending in the first direction at the second surface of the substrate; and depositing a conductive material on the second surface of the substrate and surfaces of the rigid elements to form the metal posts and conductive layer.

In one embodiment, after forming the encapsulation, the method further comprises removing the substrate and the rigid elements to reveal openings in the metal posts, the openings in the metal posts extending in the first direction from the front side of the microelectronic assembly; and filling the openings with additional conductive material prior to depositing the insulation layer.

In one embodiment, after forming the encapsulation and prior to depositing the insulation layer, the method further comprises removing the conductive layer to expose the first end surfaces of the metal posts.

In one embodiment, the method further comprises forming a second insulation layer overlying the second surface of the encapsulation and having thickness extending away from the second surface of the encapsulation; forming second connection elements extending away from the second end surfaces of the metal posts and through the thickness of the second insulation layer, wherein at least some second connection elements have cross sections smaller than cross sections of the metal posts; depositing the redistribution structure on the second insulation layer; and forming second terminals at the second side of the microelectronic assembly adjacent to the second surface of the encapsulation, wherein the second terminals are overlying the redistribution structure, wherein the second connection elements electrically connecting at least some second end surfaces with corresponding second terminals through the redistribution structure.

In one embodiment, the method further comprises forming openings extending between at least some second end surfaces of metal posts and the second surface of the encapsulation, the openings exposing at least portions of second end surfaces of the metal posts; and forming second connection elements extending through the openings in the encapsulation and electrically connected to at least some metal posts at the second end surfaces.

In one embodiment, prior to forming the structure, the front surface of the microelectronic element is attached to a carrier.

In one embodiment, forming the structure further comprises attaching the carrier to the metal posts such that the microelectronic element is juxtaposed with the first portion of the first surface of the conductive layer.

In one embodiment, the microelectronic element and the first portion of the first surface of the conductive layer are separated therefrom.

In one embodiment, after forming the encapsulation, the method further comprises removing the carrier to expose the front surface of the microelectronic element and the second end surfaces of the metal posts; and removing the conductive layer to expose the first end surfaces of the metal posts.

BRIEF DESCRIPTION OF THE DRAWINGS

FIG. 1-1 depicts a side schematic view of a microelectronic assembly in accordance with some embodiments of the invention.

FIG. 1-2 depicts a side schematic view of a microelectronic assembly in accordance with some embodiments of the invention.

FIG. 1-3 depicts a side schematic view of a microelectronic assembly in accordance with some embodiments of the invention.

FIG. 1-4 depicts a side schematic view of a microelectronic assembly in accordance with some embodiments of the invention.

FIG. 1-5 depicts a top down cross sectional view of a microelectronic assembly in accordance with some embodiments of the invention.

FIG. 1-6 depicts a partial top down schematic view of a microelectronic assembly in accordance with some embodiments of the invention.

FIG. 1-7 depicts a side schematic view of a plurality of microelectronics assemblies in a stacked structure in accordance with some embodiments of the invention.

FIG. 1-8 depicts a partial top down schematic view of a microelectronic assembly in accordance with some embodiments of the invention.

FIG. 1-9 depicts a partial top down schematic view of a microelectronic assembly in accordance with some embodiments of the invention.

FIG. 1-10 depicts a partial top down schematic view of a microelectronic assembly in accordance with some embodiments of the invention.

FIGS. 3-1 through 3-6 depict stages in a method of fabricating a microelectronic assembly in accordance with some embodiments of the invention.

FIGS. 4-1 through 4-6 depict stages in a method of fabricating a microelectronic assembly in accordance with some embodiments of the invention.

FIGS. 5-1 through 5-6 depict stages in a method of fabricating a microelectronic assembly in accordance with some embodiments of the invention.

FIGS. 6-1 through 6-5 depict stages in a method of fabricating a microelectronic assembly in accordance with some embodiments of the invention.

DETAILED DESCRIPTION

The present invention will be described in more detail below.

All ranges recited herein include the endpoints, including those that recite a range "between" two values. Terms such as "about," "generally," "substantially," and the like are to be construed as modifying a term or value such that it is not an absolute, but does not read on the prior art. Such terms will be defined by the circumstances and the terms that they modify as those terms are understood by those of skill in the art. This includes, at very least, the degree of expected experimental error, technique error and instrument error for a given technique used to measure a value.

It should be further understood that a description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.3, 3, 4, 5, 5.7 and 6. This applies regardless of the breadth of the range.

As used in this disclosure with reference to a component, a statement that an element, e.g., a conductive element, contact, metal post, terminal, structure, or other element, is "at" a surface of a component, e.g., microelectronic element, interposer, circuit panel, or other substrate, indicates that, when the component is not assembled with any other element, the element is available for contact with a theoretical point moving in a direction perpendicular to the surface of the component toward the surface of the component from outside the component. Thus, an element which is at a surface of a component may project from such surface; may be flush with such surface; or may be recessed relative to such surface in a hole or depression in the component.

Figure 11:
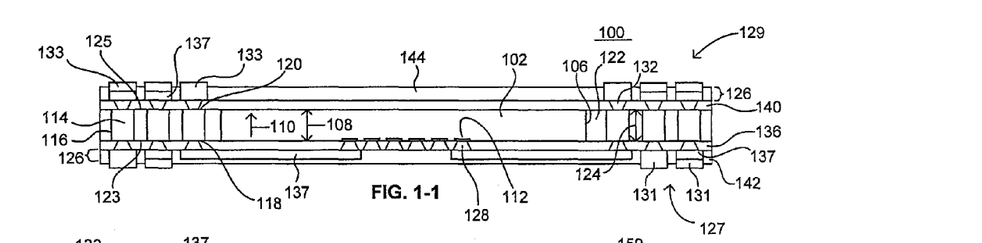
Figure 12:
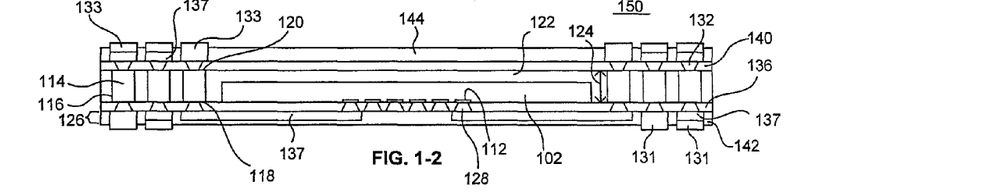
Figure 13:
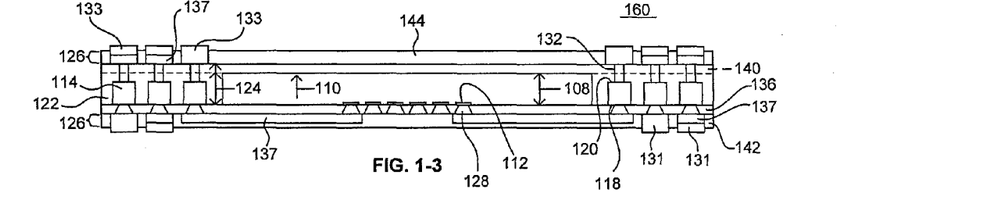

FIGS. 1-1 through 1-3 depict microelectronic assemblies in accordance with some embodiments of the invention. The various embodiments of the microelectronic assemblies disclosed herein may be utilized alone, or combination.

FIG. 1-1 depicts a side schematic view of a microelectronic assembly 100 in accordance with some embodiments of the invention. The microelectronic assembly 100 includes a microelectronic element 102. The microelectronic element 102 may have a front surface 104 and edge surfaces 106 bounding the front surface 104. A first thickness 108 of the microelectronic element 102 can extend in a first direction 110 away from the front surface 104. The microelectronic element can include a plurality of contacts 112 at the front surface 104. Exemplary microelectronic elements 102 can include any one or more of a semiconductor die, packaged semiconductor chip, or the like.

Figure 15:
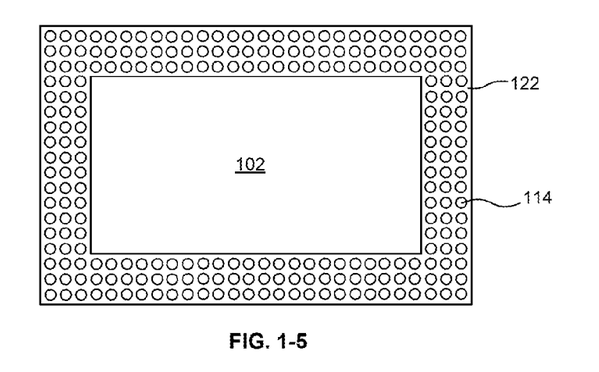
Figure 16:
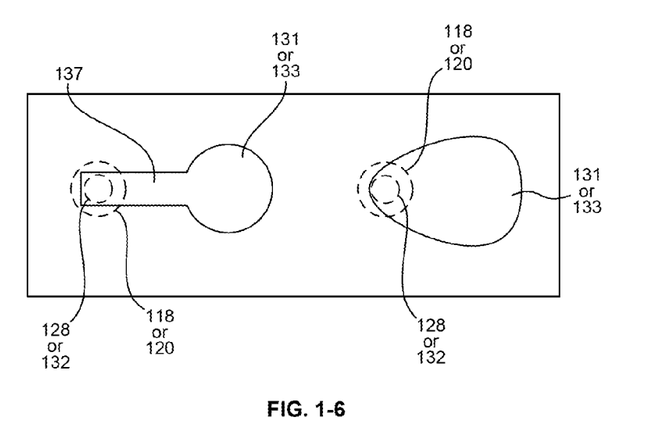

The microelectronic assembly 100 includes a plurality of substantially rigid metal posts 114 disposed between at least one of the edge surfaces 106 and a corresponding edge of the microelectronic assembly 100. One exemplary top down schematic view of the microelectronic assembly 100 having the microelectronic element 102 and metal posts 114 is depicted in FIG. 1-5.

Each metal post 114 includes a sidewall 116 separating first and second end surfaces 118, 120 from one another in the first direction 110. The sidewalls 116 of the metal posts 114 can have a root mean square (rms) surface roughness of less than about 1 microns. Such a low surface roughness of the sidewalls 116 may be achieved using methods disclosed herein and discussed below. In one embodiment, the metal posts can be greater than about 99% cylindrical. For example, low surface roughness, shape, and other features of the metal posts can be formed by methods discussed herein. The metal posts 114 may include one or more metals selected from copper (Cu), nickel (Ni), gold (Au), or alloys thereof. The microelectronic element 100 includes a encapsulation 122 having a second thickness 124 extending in the first direction 110 between first and second surfaces 123, 125 of the encapsulation 122. The encapsulation 122 contacts at least the edge surfaces 106 of the microelectronic element 102 and the sidewalls 116 of the plurality of metal posts 114. In one embodiment, such as depicted in FIG. 1-1, the second thickness 124 of encapsulation 122 is about equal to the first thickness 108 of the microelectronic element 102. The encapsulation 122 can be formed by molding an encapsulant material, e.g., a potting compound. In a particular example, the encapsulation 122 can be particulate composite layer which includes a polymeric matrix and particulate loading within the polymeric matrix. Such composite layer can be formed, for example by depositing an uncured polymeric material which has the particulate loading material therein, the particulate loading material optionally being a dielectric material having a low coefficient of thermal expansion ("CTE").

The metal posts 114 extend at least partially through the encapsulation 122. In one embodiment, such as depicted in FIGS. 1-1, the metal posts 114 extending entirely through the second thickness 124 of the encapsulation 122 from a first side 127 to a second side 129 of the microelectronic assembly 100. The first and second sides 127, 129 may be adjacent to the first and second surfaces 123, 125, respectively, of the encapsulation 122.

Figure 17:
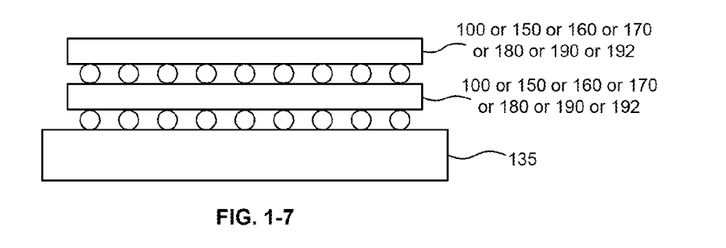

The microelectronic assembly 100 can have terminals 131 at the first side 127 of the microelectronic assembly. In some embodiments, the microelectronic assembly can have second terminals 133 at the second side 129 of the microelectronic assembly. The terminals 131, 133 can provide surfaces form electrically coupling the microelectronic assembly 100 to other components, such as another microelectronic assembly, an interposer, a printed circuit board (PCB), or other such components, the components adjacent to the first and second sides 127, 129, respectively of the microelectronic assembly. In one exemplary embodiment, the microelectronic assembly can be included in a vertically stacked structure as depicted in FIG. 1-7. For example, another microelectronic assembly can be stacked adjacent to the second side 129 and overlying the microelectronic assembly, and a the microelectronic assembly in turn can be stacked at the first side 127 thereof to overlie a circuit panel 135, or another component, such as an interposer. Many vertical stacking arrangements and components are possible, and not limited to the exemplary embodiment depicted in FIG. 1-7.

The microelectronic assembly 100 may include an insulation layer 136 at the first side 127 of the microelectronic assembly 100. In one exemplary embodiment, the insulation layer comprises a dielectric material. The insulation layer 136 overlies the front surface 104 of the microelectronic element 102 and the first end surfaces 118 of the metal posts 114. Connection elements 128 can extend away from the first end surfaces 118 and through the thickness of the insulation layer 136 to electrically connect with the first end surfaces 118 and contacts 112. The connection elements 128 can connect at least some of the first end surfaces 118 with corresponding terminals 131. As depicted in FIGS. 1-1 through 1-4, the terminals 131 may be coupled to the first connection elements through a redistribution structure 126. However, in some embodiments, the terminals 131 may overlie the insulation layer 136. In other embodiments, the terminals 131 may be formed in the insulation layer 136, or alternatively in another insulation layer overlying the insulation layer 136. The insulation layer 136 can include one or more of a polymeric material, such as polyimide, polyamide, or a photoimageable material, which in some instances can be benzocyclobutane (BCB).

The microelectronic assembly 100 may include a second insulation layer 140 at the second side 129 of the microelectronic assembly 100. The second insulation layer 140 can include any embodiments and/or permutations as described for the insulation layer 136. Second connection elements 132 can extend away from the second end surfaces 120 and through the thickness of the second insulation layer 140 to electrically connect with the second end surfaces 120. The second connection elements 132 can connect at least some of the second end surfaces 120 with corresponding second terminals 133. The second connection elements can include any embodiments and/or permutations as described for the connection elements 128.

At least some of the connection elements 128, 132 can have a cross section that is smaller than that of the metal posts 114 at the first and second ends surfaces 118, 120, respectively. In some instances, the smaller cross section of the connection elements 128, 132 can improve alignment with the metal posts 114. Improved alignment can result in improved routing. The connection elements 128, 132 can have sidewalls that have rms surface roughness that is greater than that of the sidewalls 116 of the metal posts 114. In one embodiment, the sidewalls of the connection elements 128, 132 have a rms surface roughness greater than about 1 micron. The connection elements 128, 132 can be formed from any suitable materials, such as those materials discussed above for the metal posts 114, or other materials. The compositions of a metal post 114 and corresponding connection elements 128, 132 can be the same or different.

The microelectronic assembly 100 includes an electrically conductive redistribution structure 126 deposited onto at least one of the insulation layers 136, 140. For example, in some embodiments, such as depicted a FIGS. 1-1 through 1-3 the redistribution structure can be deposited on both the insulation layers 136, 140. Alternatively, in one exemplary embodiment depicted in FIG. 1-4, the redistribution structure 126 is deposited on the insulation layer 136, but there is no redistribution structure and/or second insulation layer 140 deposited onto the second end surfaces 120. In such embodiments, the second end surfaces 120 may serve as the second terminal 133. In some embodiments, the redistribution structure 126 is integral with one and/or both insulation layers 136, 140 and corresponding one and/or both connection elements 128, 132.

The redistribution structure 126 includes at least one of a portion of at least one terminal 131 disposed beyond the edge surface of the metal post 114 with which such terminal 131 is coupled, or a portion of at least one second terminal 133 disposed beyond the edge surface of the metal post 114 with which such second terminal 133 is coupled. In exemplary embodiments, as depicted in top down view in FIG. 1-6, the redistribution structure can includes traces 137 extending in a second direction transverse to the first direction 110 beyond the edge surfaces of the metal posts 114. At least one of the terminals 131 can be electrically coupled with the first end surfaces 118 through the traces 131. Similarly, at least one of the second terminals 133 can be electrically coupled with the second end surfaces 120 through the traces 137. In other embodiments, such as depicted in FIGS. 1-1 through 1-4 at the first side 127 of the microelectronic assembly, at least some traces 137 can electrically couple contacts 112 of the microelectronic element 102 to the metal posts 114. In other embodiments, such as depicted in FIG. 1-6, one and/or both terminals 113, 133 can be an integral structure that includes aspects of traces in that it extends beyond the edge surfaces of the metal posts 114 as depicted in the right hand side of FIG. 1-6.

FIG. 1-2 depicts a side schematic view of a microelectronic assembly 150 in accordance with some embodiments of the invention. The microelectronic assembly 150 can include any embodiments and/or permutations as described for the microelectronic assembly 100, except where otherwise noted. In one embodiment of the invention, as shown in the microelectronic assembly 150, the second thickness 124 of the encapsulation 122 can exceed the first thickness 108 of the microelectronic element 102.

FIG. 1-3 depicts a side schematic view of a microelectronic assembly 160 in accordance with some embodiments of the invention. The microelectronic assembly 160 can include any embodiments and/or permutations as described for the microelectronic assembly 100, except where otherwise noted. In one embodiment of the invention, as shown in the microelectronic assembly 160, the metal posts 114 partially extend in the first direction 110 through the second thickness 124. In one embodiment, the metal posts extend in the first direction 110 of the second thickness 124 to at least about 50% of the second thickness 124. In one embodiment, the second connection elements 132 can extend in the first direction of the second thickness 124 of the encapsulation 122 from the second end surfaces 120 of the metal posts 114 as depicted in FIG. 1-3. Though depicted as having a smaller cross section than that of the metal posts 114 at the second end surfaces 120, in some embodiments, the second connection elements 132 can have a larger cross section than that of the metal posts 114. Optionally, the second dielectric layer 140 can be omitted from the microelectronic assembly 160.

Figure 14:
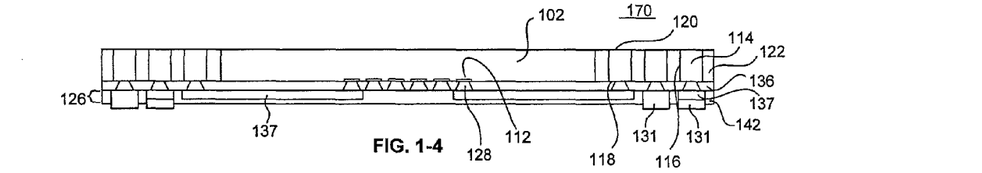

FIG. 1-4 depicts a side schematic view of a microelectronic assembly 170 in accordance with some embodiments of the invention. The microelectronic assembly 170 can include any embodiments and/or permutations as described for the microelectronic assembly 100, except where otherwise noted. As depicted in FIG. 1-4, the microelectronic assembly 170 does not include the redistribution structure 126 deposited onto the second end surfaces 120.

Figure 18:
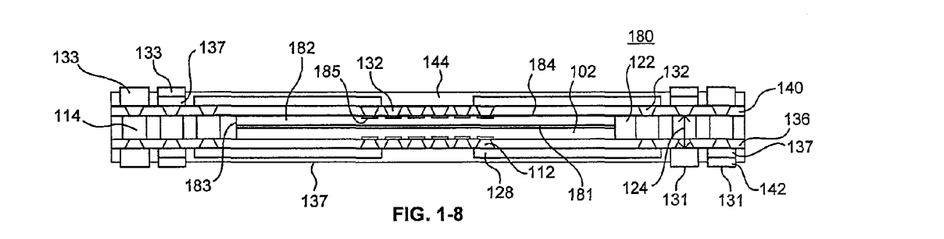

FIG. 1-8 depicts a side schematic view of a microelectronic assembly 180 in accordance with some embodiments of the invention. The microelectronic assembly 180 can include any embodiments and/or permutations as described for the microelectronic assembly 100, except where otherwise noted. As depicted in FIG. 1-8, the microelectronic assembly 180 includes a second microelectronic element 182. In some embodiments, the second microelectronic element 182 is at least partially overlying the microelectronic element 102. In one example, as depicted in FIG. 1-8, the second microelectronic element completely overlies the microelectronic element 102. The second microelectronic element 182 can include a first surface 181, and edge surfaces 183 bounding the first surface 181. The second microelectronic element 182 can have a thickness extending in the first direction away from the first surface 181 of the second microelectronic element 182 towards a second surface 184 of the second microelectronic element 182. The microelectronic element 182 can have contacts 185 at the second surface 184. At least some of the metal posts 114 can be electrically coupled with the contacts 185 of the second microelectronic element 182. In one example, the contacts 185 can be electrically coupled with the metal posts 114 through the second connection elements 132 and traces 137.

Figure 19:
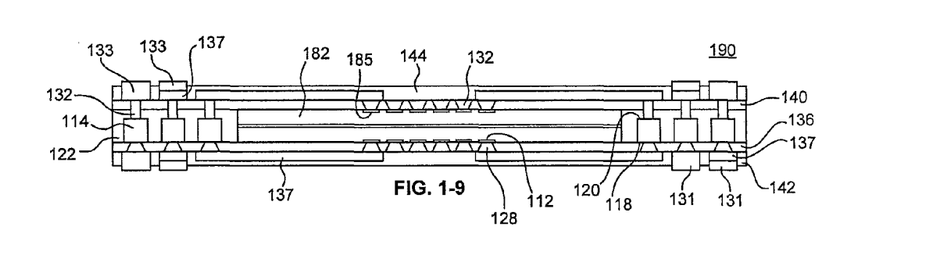

FIG. 1-9 depicts a side schematic view of a microelectronic assembly 190 in accordance with some embodiments of the invention. The microelectronic assembly 190 can include any embodiments and/or permutations as described for the microelectronic assembly 160, except where otherwise noted. As depicted in FIG. 1-9, the microelectronic assembly 190 includes the second microelectronic element 182.

Figure 110:
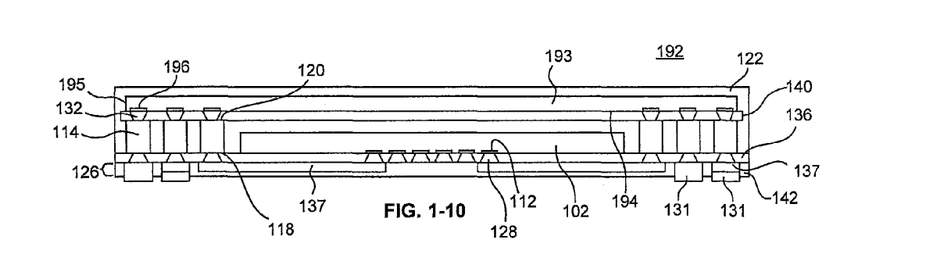

FIG. 1-10 depicts a side schematic view of a microelectronic assembly 192 in accordance with some embodiments of the invention. The microelectronic assembly 192 can include any embodiments and/or permutations as described for the microelectronic assembly 100, except where otherwise noted. As depicted in FIG. 1-10, the redistribution layer 126 can, optionally, be absent above the second insulation layer 140. A second microelectronic element 193 overlies the second insulation layer 140. The second microelectronic element 193 having a first surface 194, and edge surfaces 195 bounding the first surface 194. The second microelectronic element 193 having a thickness extending in the first direction and away from the first surface 194. The microelectronic element 193 can have contacts 196 at the first surface 194. In one example, the contacts 196 can be directly coupled to the second connection elements 132. In another example, where the redistribution layer 126 is disposed between the insulation layer 140 and the second microelectronic element 193, the contacts 196 can be electrically coupled to at least some of the second connection elements 132 through the redistribution layer 126. The encapsulation 122 can contact at least the edge surfaces 195 of the second microelectronic element 193. In one example, the encapsulation 122 can surround the second microelectronic element 193.

Figure 2:
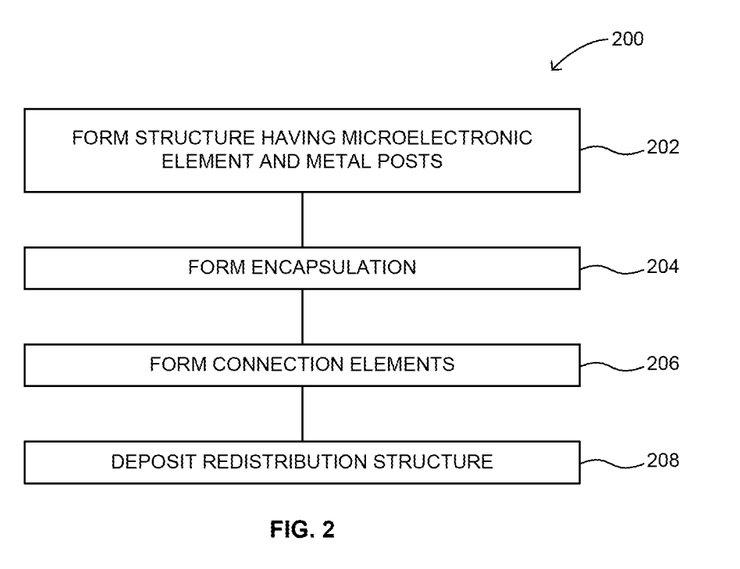
FIG. 2 depicts a flow chart for a method of forming a microelectronic assembly in accordance with some embodiments of the invention.

FIG. 2 depicts a flow chart of a method 200 for fabrication of a microelectronic assembly in accordance with some embodiments of the present invention. The method 200 is described below in accordance with stages of fabricating the microelectronic assemblies 100, 160, and 150 respectively depicted in FIGS. 3-1 through 3-6, FIGS. 4-1 through 4-6, and FIGS. 5-1 through 5-6. However, the method 200 may be applied to other embodiments of the present invention, or other microelectronic assemblies within the scope of the invention.

Figure 31:
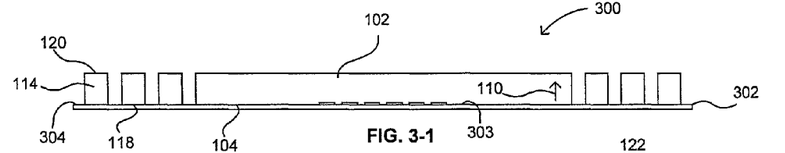

FIG. 3-1 depicts a structure 300 having the microelectronic element 102 and the metal posts 114. The structure 300, as depicted in FIG. 3-1, may include the microelectronic element 102 and the metal posts 114 supported at the front surface 104 and first end surfaces 118, respectively, by a conductive layer 302. At 202, the structure 300 can be formed by attaching the front surface 104 of the microelectronic element 102 to a first portion 303 of a first surface 304 of the conductive layer 302. The metal posts 114 are disposed between the first portion 303 of the first surface 304 and a corresponding edge of the conductive layer 302.

Prior to attachment of the microelectronic element 102 to the conductive layer 302, the metal posts 114 may be preformed on the first surface 304 of the conductive layer 302. For example, metal can be plated into openings in a patterned photoresist, the photoresist overlying the conductive layer 302, to form the metal posts 114. Other suitable methods for forming metal posts may be employed including, e.g., sputtering, sintering, other physical or chemically enhanced deposition processes.

Figures 32, 33:
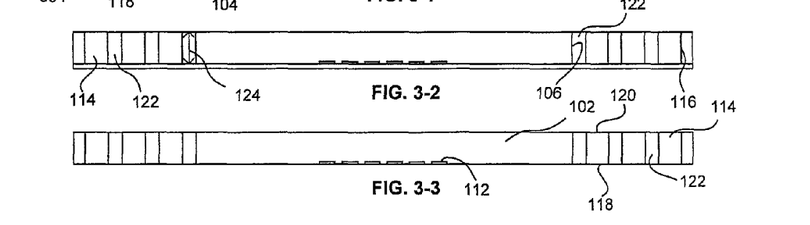

At 204, the encapsulation 122 can be formed. The encapsulation 122 can be formed by molding. Optionally, after molding the encapsulation 122, the encapsulation 122 can be thinned to achieve the desired second thickness 124. As depicted in FIG. 3-2, the encapsulation 122 can contact at least the edge surfaces 106 of the microelectronic element 102 and the sidewalls 116 of the metal posts 114. In embodiments of the microelectronic assembly 100, the first thickness 108 of the microelectronic element 102 and the second thickness 124 of the encapsulation region 122 are the same.

After formation of the encapsulation 122, the conductive layer 302 can be removed to expose the first end surfaces 118 of the metal posts 114. The structure 300 is depicted after removed of the conductive layer 302 in FIG. 3-3. The conductive layer 302 can be removed by any suitable process, such as etching, polishing, or combinations thereof.

Figure 34:
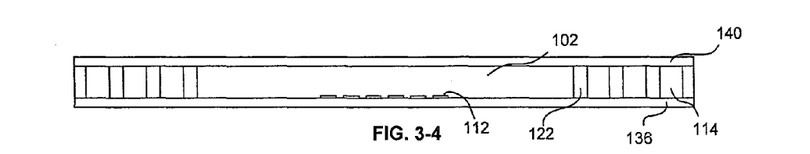
Figure 35:
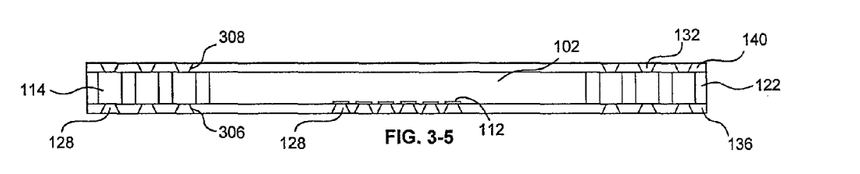

At 206, the insulation layer 136 and the connection elements 128 can be formed at the first side 127 of the microelectronic assembly 100 as depicted in FIGS. 3-3 through 3-4. The insulation layer 136 can be formed overlying the front surface of the microelectronic element 102 and the first end surfaces 118 of the metal posts 114. Openings 306 can be formed, the openings 306 extending in the first direction 110 of thickness of the insulation layer 136 and exposing at least portions of the first end surfaces 118 of the metal posts 114 and contacts 112 of the microelectronic element 102. The openings 306 can be formed by optical lithography followed by removal of materials of the insulation layer 136 to expose portions of the first end surfaces 118 and contacts 112. Alternatively, the openings 306 can be formed by laser or mechanical drilling. The openings 306 can have rough sidewall surfaces, which can contribute to the connection elements 128 having an rms surface roughness of greater than about 1 micron. The connection elements 128 can be formed in the openings 306 by plating, physical vapor deposition (PVD), chemical vapor deposition (CVD) or the like.

Similarly, the second insulation layer 140 can be formed overlying the microelectronic element 102 and the second end surfaces 120 of the metal posts 114. Openings 308 can be formed, the openings 308 extending in the first direction 110 of thickness of the second insulation layer 140 and exposing at least portions of the second end surfaces 120 of the metal posts 114. The openings 308 include any embodiments and/or permutations and/or methods of fabrication as described for the openings 308. The second connection elements 132 can be formed in the openings 308 by plating, physical vapor deposition (PVD), chemical vapor deposition (CVD) or the like.

Figure 36:
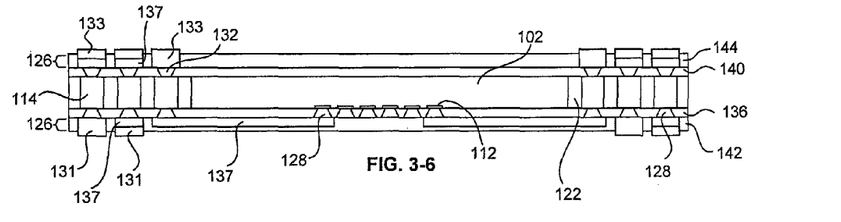

At 208, the redistribution structure 126 is deposited. As depicted in FIGS. 3-6, the redistribution structure 126 is overlying the insulation layers 136, 140. The redistribution structure 126 can include one or more insulation layers 142, 144 respectively overlying the insulation layers 136, 140. The one or more insulation layers 142, 144 can be patterned to expose at least portions of surfaces of the connection elements 128, 132. The terminals 131, 133 can be electrically coupled to the surfaces of the connection elements 128, 132. The terminals 131, 133 can be formed by any suitable method, such as plating or the like.

Though described above as being sequentially fabricated on the first side 130 and second side 134 of the microelectronic assembly 100, the redistribution structure 126 can be fabricated by any suitable order of process steps. For example, the insulation layers 136, 140 may be formed, followed by the openings 306, 308, followed by the first and second connection elements 128, 132, or other desired ordering of the process steps.

FIGS. 4-1 through 4-6 depict stages in a method of fabricating the microelectronic assembly 160 in accordance with some embodiments of the invention. Some aspects of fabricating the microelectronic assembly 160 are similar to those discussed above in regards to fabrication of the microelectronic assembly 100.

Figures 41, 42:
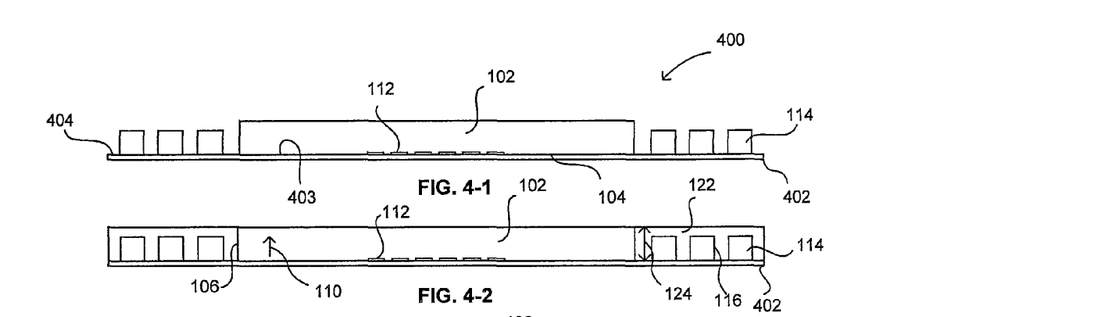

FIG. 4-1 depicts a structure 400 having the microelectronic element 102 and the metal posts 114. The structure 400, as depicted in FIG. 4-1, may include the microelectronic element 102 and the metal posts 114 supported at the front surface 104 and first end surfaces 118, respectively, by a conductive layer 402. At 202, the structure 400 can be formed by attaching the front surface 104 of the microelectronic element 102 to a first portion 403 of a first surface 404 of the conductive layer 402. The metal posts 114 are disposed between the first portion 403 of the first surface 404 and a corresponding edge of the conductive layer 402.

Prior to attachment of the microelectronic element 102 to the conductive layer 402, the metal posts 114 may be pre-formed on the first surface 404 of the conductive layer 402. The pre-forming of the metal posts 114 on the conductive layer 402 can include any embodiments and/or permutations and/or methods of fabrication as described for the pre-forming of the metal posts 114 on the conductive layer 302.

At 204, the encapsulation 122 can be formed. The encapsulation 122 can be formed by molding. Optionally, after molding the encapsulation 122, the encapsulation 122 can be thinned to achieve the desired second thickness 124. As depicted in FIG. 4-2, the encapsulation 122 can contact at least the edge surfaces 106 of the microelectronic element 102 and the sidewalls 116 of the metal posts 114. In embodiments of the microelectronic assembly 160, the metal posts 114 extend in the first direction 110 of the second thickness 124 up to about 50% of the second thickness 124.

Figure 43:
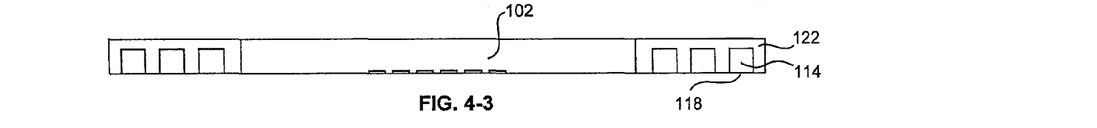

After formation of the encapsulation 122, the conductive layer 402 can be removed to expose the first end surfaces 118 of the metal posts 114. The structure 400 is depicted after removed of the conductive layer 402 in FIG. 4-3. The conductive layer 402 can be removed by any suitable process, such as etching, polishing, or combinations thereof.

Figure 44:
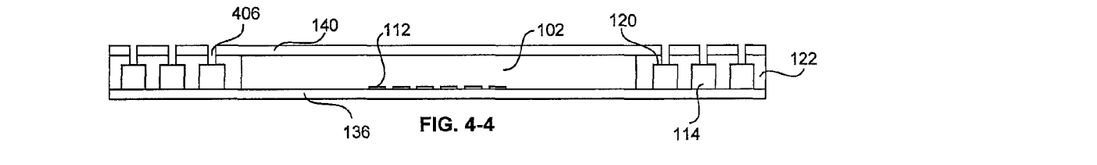
Figure 45:
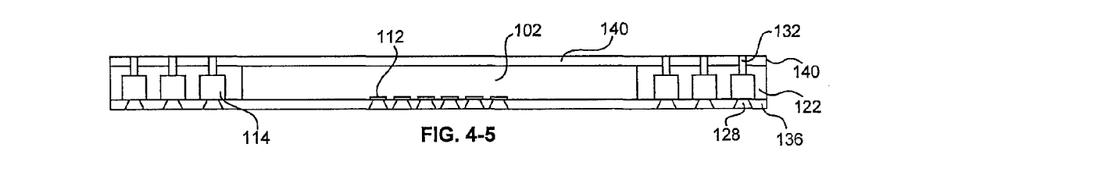

At 206, the insulation layer 136 and the connection elements 128 can be formed at the first side 127 of the microelectronic assembly 160 as depicted in FIGS. 4-3 through 4-4 in some aspects of the invention. The formation of the insulation layer 136 and connection elements 128 can include any embodiments and/or permutations and/or methods of fabrication as described for the fabrication of those elements in the microelectronic assembly 100.

Optionally, the second insulation layer 140 can be formed overlying the microelectronic element 102 and the second end surfaces 120 of the metal posts 114. Openings 406 can be formed, the openings 406 extending in the first direction 110 of thickness of the encapsulation 122, and optionally the second insulation layer 140 when present. The openings 406 expose at least portions of the second end surfaces 120 of the metal posts 114. The openings 406 can be formed by optical lithography followed by removal of materials of the encapsulation 122, and optionally the second insulation layer 140 when present, to expose portions of the second end surfaces 120 of the metal posts 114. Alternatively, the openings 406 can be formed by laser or mechanical drilling. The openings 406 can have rough sidewall surfaces, which can contribute to the second connection elements 132 having an rms surface roughness of greater than about 1 micron. The second connection elements 132 can be formed in the openings 406 by plating, physical vapor deposition (PVD), chemical vapor deposition (CVD) or the like.

Figure 46:
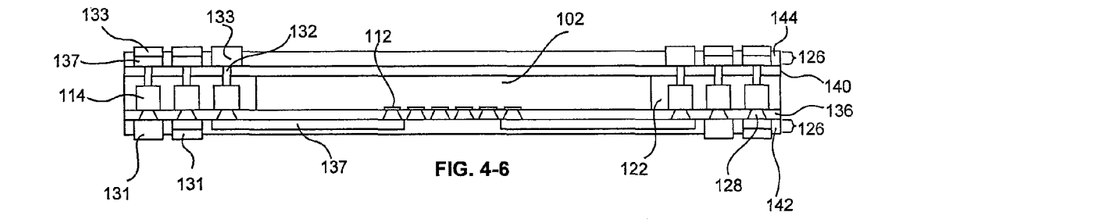

At 208, the redistribution structure 126 is deposited. As depicted in FIGS. 4-6, the redistribution structure 126 is overlying the insulation layers 136, 140. The redistribution structure 126 can include can include any embodiments and/or permutations and/or methods of fabrication as described for the fabrication of those elements in the microelectronic assembly 100.

Though described above as being sequentially fabricated on the first side 127 and second side 129 of the microelectronic assembly 160, the redistribution structure 126 can be fabricated by any suitable order of process steps.

FIGS. 5-1 through 5-6 depict stages in a method of fabricating the microelectronic assembly 150 in accordance with some embodiments of the invention. Some aspects of fabricating the microelectronic assembly 150 are similar to those discussed above in regards to fabrication of the microelectronic assemblies 100 and 150.

Figures 51, 52:
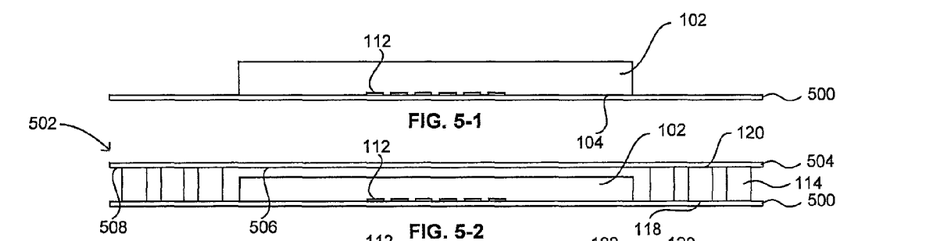

FIG. 5-1 depicts the microelectronic element 102 supported on the front surface 104 by a carrier 500. A structure 502, as depicted in FIG. 5-2, may include the microelectronic element 102 supported by the carrier 500 at the front surface 104 and the metal posts 114 supported at second end surfaces 120 by a conductive layer 504. At 202, the structure 502 can be formed by attaching the first end surfaces 118 of the metal posts 114 to the carrier 500 such that the microelectronic element 102 is juxtaposed with a first portion 506 of a first surface 508 of the conductive layer 504. The metal posts 114 may be disposed between the first portion 506 of the first surface 508 and a corresponding edge of the conductive layer 504 and extending from the first surface 508.

Prior to attachment to the carrier 500, the metal posts 114 may be pre-formed on the first surface 508 of the conductive layer 504. The pre-forming of the metal posts 114 on the conductive layer 504 can include any embodiments and/or permutations and/or methods of fabrication as described for the pre-forming of the metal posts 114 on the conductive layers 302 or 402.

Figure 53:
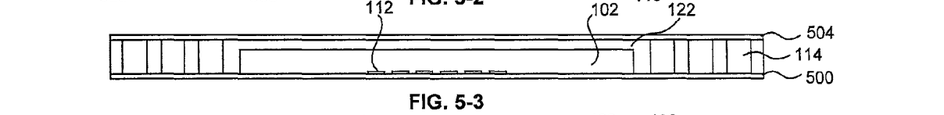

At 204, the encapsulation 122 can be formed. The encapsulation 122 can be formed by molding. As depicted in FIGS. 5-2 through 5-3, the second thickness 124 of the encapsulation 122 can be defined between the conductive layer 504 and the carrier 500. Though depicted as having a first thickness 108 less than the second thickness 124 of the encapsulation 122 in FIG. 5-3, the microelectronic element 102 may have a first thickness 108 equal to the second thickness 124 of the encapsulation 122 in some aspects of the invention.

Figure 54:
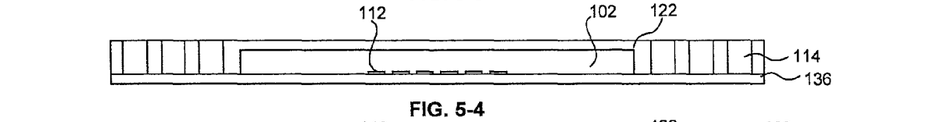

After formation of the encapsulation 122, the carrier 500 and conductive layer 504 can be removed to expose the first and second end surfaces 118, 120, respectively, of the metal posts 114. The structure 400 is depicted after removed of the conductive layer 504 and the carrier 500 in FIG. 5-4. The conductive layer 504 and the carrier 500 can be removed by any suitable process, such as etching, polishing, or combinations thereof.

Figure 55:
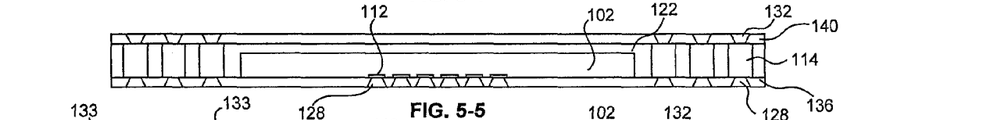
Figure 56:
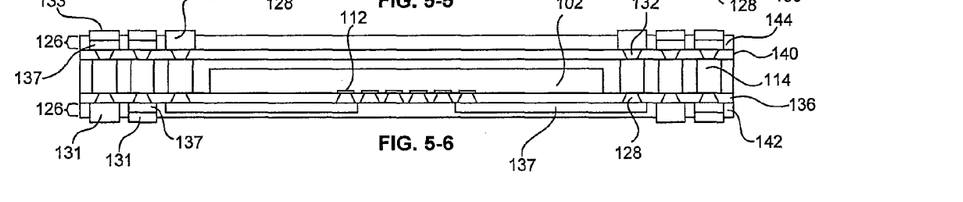
Figure 61:
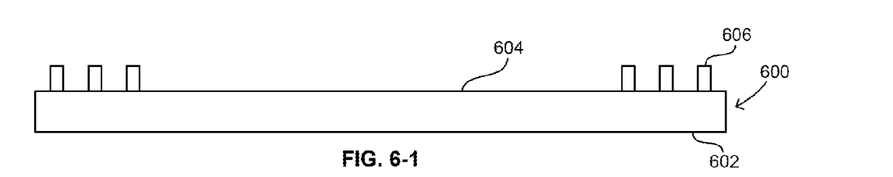
Figure 62:
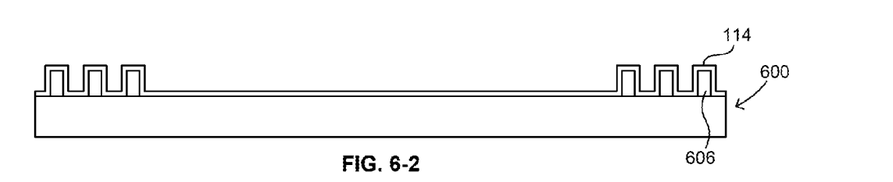
Figure 63:
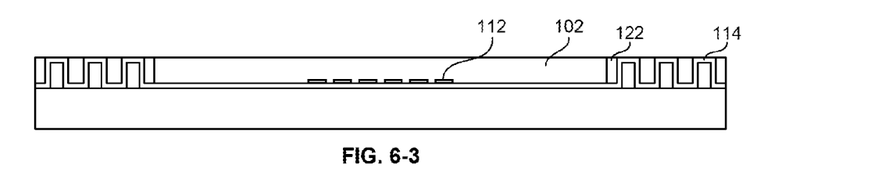
Figure 64:
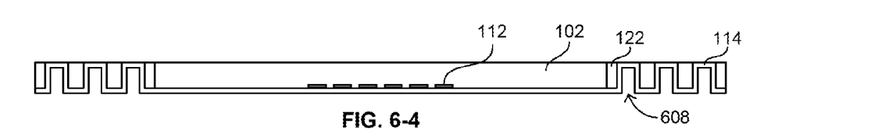
Figure 65:
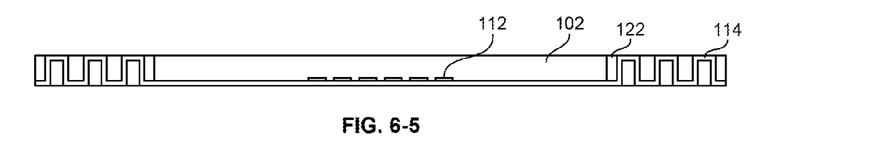

At 206 and 208, the insulation layers 136, 140, the connection elements 128, 130, and the redistribution structure 126 are formed as depicted in FIGS. 5-4 through 5-6 in one aspect of the invention. Forming the insulation layers 136, 140, the connection elements 128, 130, and the redistribution structure 126 includes any embodiments and/or permutations and/or methods of fabrication as described above with regards to forming the redistribution structure of the microelectronic assembly 100.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

For example, FIG. 6-1 through 6-5 depicts stages of fabrication of a microelectronic assembly in accordance with some embodiments of the invention. For example, the stages of fabrication depicted in FIGS. 6-1 through 6-5 may be used alternatively to those stages of fabrication depicted in FIGS. 3-1 through 3-2 or FIGS. 4-1 through 4-2. As depicted in FIG. 6-1, a substrate 600 can be provided. The substrate 600 can have a thickness extending in the first direction from a first surface 602 to a second surface 604. The substrate 600 can have rigid elements 606 extending in the first direction at the second surface 604 of the substrate 600. As depicted in FIG. 6-2, a conductive material can be deposited on the second surface 604 and surfaces of the rigid elements 606 to form metal posts 114 and conductive layer. The microelectronic element 102 can be attached to the conductive layer, and then the encapsulation 122 can be formed, such as depicted in FIG. 6-3. The substrate 600 may then be removed to reveal openings 608 in the metal posts 114. The openings in the metal posts 114 extending in the first direction from the front side 127 of the microelectronic assembly. The openings 608 can be filled with material, such as additional conductive material, as depicted in FIG. 6-5.

The invention claimed is:

1. A microelectronic assembly, comprising:
a microelectronic element having a front surface, edge surfaces bounding the front surface, and contacts at the front surface, the microelectronic element having a first thickness extending in a first direction away from the front surface;
substantially rigid metal posts extending in the first direction, the posts disposed between at least one of the edge surfaces and a corresponding edge of the microelectronic assembly, each metal post having a sidewall separating first and second end surfaces of such metal post from one another in the first direction, wherein the sidewalls of the metal posts have a root mean square (rms) surface roughness of less than about 1 micron;
a encapsulation having a second thickness extending in the first direction between first and second surfaces of the encapsulation, the encapsulation contacting at least the edge surfaces of the microelectronic element and the sidewalls of the metal posts, wherein the metal posts extend at least partly through the second thickness, and the encapsulation electrically insulates adjacent metal posts from one another;
the microelectronic assembly having first and second sides adjacent the first and second surfaces of the encapsulation, respectively, and having terminals at the first side;
an insulation layer overlying the first surface of the encapsulation at the first side and having a thickness extending away from the first surface of the encapsulation,
connection elements extending away from the first end surfaces of the metal posts and through the thickness of the insulation layer, the connection elements electrically connecting at least some of the first end surfaces with corresponding terminals, wherein at least some connection elements have cross sections smaller than cross sections of the metal posts; and
an electrically conductive redistribution structure deposited on the first insulation layer, wherein the redistribution structure electrically connects the terminals with corresponding first end surfaces of the metal posts through at least some of the connection elements, wherein at least some of the metal posts are electrically coupled with the contacts of the microelectronic element.

2. The microelectronic assembly of claim 1, wherein the metal posts extend from the first surface of the encapsulation to the second surface of the encapsulation.

3. The microelectronic assembly of claim 1, wherein the first thickness is one of smaller or equal to the second thickness.

4. The microelectronic assembly of claim 1, further comprising:
   second connection elements extending in the first direction of the second thickness of the encapsulation from the second end surfaces of the metal posts to the second surface of the encapsulation.

5. The microelectronic assembly of claim 4, wherein the second connection elements have sidewalls having an rms surface roughness of greater than about 1 micron.

6. The microelectronic assembly of claim 4, wherein the metal posts extend in the first direction of the second thickness of the encapsulation to at least about 50% of the second thickness.

7. The microelectronic assembly of claim 4, wherein at least some of the second connection elements have a cross section smaller than that of the metal posts.

8. The microelectronic assembly of claim 4, further comprising:
   second terminals at the second side of the microelectronic assembly, and
   wherein the redistribution structure is deposited on the second side of the microelectronic assembly and electrically connects the second terminals with corresponding second end surfaces of the metal posts through at least some of the second connection elements.

9. The microelectronic assembly of claim 1, further comprising:
   second terminals at the second side of the microelectronic assembly;
   a second insulation layer overlying the second surface of the encapsulation at the second side of the microelectronic assembly and having thickness extending away from the second surface of the encapsulation; and
   second connection elements extending away from the second end surfaces of the metal posts and through the thickness of the second insulation layer, the second connection elements electrically connecting at least some of the second end surfaces with corresponding second terminals, wherein at least some second connection elements have cross sections smaller than cross sections of the metal posts.

10. The microelectronic assembly of claim 1, wherein the first and second thicknesses are the same.

11. The microelectronic assembly of claim 1, further comprising:
   second terminals at the second side of the microelectronic assembly,
   wherein the redistribution structure includes traces extending in a second direction transverse to the first direction beyond the edge surfaces of the metal posts, wherein at least one of the first terminals is electrically coupled with the first end surfaces through the traces, or at least one of the second terminals is electrically coupled with the second end surfaces through the traces.

12. The microelectronic assembly of claim 1, further comprising:
   a second microelectronic element at least partly overlying the first microelectronic element, wherein the second microelectronic element having a first surface, edge surfaces bounding the first surface, the second microelectronic element having a thickness extending in the first direction away from the first surface of the second microelectronic element, wherein the encapsulation contacts at least the edge surfaces of the second microelectronic element.

\* \* \* \* \*